United States Patent [19]

Luce

[11] 4,028,979

[45] June 14, 1977

[54] MULTIPLEXER FOR ELECTRONIC MUSICAL INSTRUMENT

[75] Inventor: David A. Luce, Clarence Center, N.Y.

[73] Assignee: Norlin Music, Inc., Lincolnwood, Ill.

[22] Filed: June 19, 1975

[21] Appl. No.: 588,359

[52] U.S. Cl. .............................. 84/1.24; 84/1.01; 84/1.03; 84/423

[51] Int. Cl.² ................. G10H 1/02; G10F 1/00; G10C 3/12

[58] Field of Search ............. 84/1.03, 1.09, 1.12; 84/1.21, 1.24, 1.25, 1.27, 423

[56] References Cited
UNITED STATES PATENTS

| | | | |
|---|---|---|---|
| 3,725,562 | 4/1973 | Munch et al. | 84/1.24 |
| 3,746,773 | 7/1973 | Uetrecht | 84/1.01 |
| 3,842,184 | 10/1974 | Kniepkamp | 84/1.01 |
| 3,899,951 | 8/1975 | Griffith | 84/1.01 |
| 3,968,716 | 7/1976 | Clark, Jr. et al. | 84/1.01 |

Primary Examiner—E. S. Jackmon
Attorney, Agent, or Firm—Hill, Gross, Simpson, Van Santen, Steadman, Chiara & Simpson

[57] ABSTRACT

An electronic musical instrument has a ring oscillator incorporating a multiplicity of identical stages connected to form a ring with the output of each stage being connected to the input of the succeeding stage. Each stage has an RC time constant circuit which introduces a delay in the transmission of a signal from one stage to the next, in accordance with the value of the capacitance of the RC circuit. The capacitance is varied in response to the amount of pressure acting on a key of the keyboard of the musical instrument, and the interval between a succession of pulses presented to an output terminal of the oscillator is dependent upon the force with which the keys are depressed, and the positions within the output pulse train at which such delays are introduced is dependent upon the position of the keys of the keyboard. The output pulse train contains information identifying all of the operated keys of the keyboard and the force with which they are operated. This information is decoded to select one of a plurality of tones produced by a tone signal source, and is also decoded to produce such tones with amplitudes corresponding to the force with which their corresponding keys are depressed.

13 Claims, 7 Drawing Figures

MULTIPLEXER FOR ELECTRONIC MUSICAL INSTRUMENT

BACKGROUND OF THE INVENTION

1. Field of the Invention

The present invention relates to electronic musical instruments, and more particularly to a method and apparatus for multiplexing information relating to the identity and operating force of operated keys.

2. The Prior Art

Multiplexing schemes for electronic musical instruments have been developed in the prior art, by which a single pulse train is produced as an output from a multiplexer, with certain pulses present in the pulse train at times which are dependent upon the operated keys of the keyboard.

It is desirable for some purposes to have the amplitude of the various tones produced in response to operation of the keys of the keyboard controlled in accordance with the force by which the keys are operated. The multiplexing systems of the prior art, however, are incapable of doing this, and are able only to identify the keys which have been selected, without giving any additional information with respect to the force by which the keys are operated.

It is therefore desirable to provide a method and apparatus by which not only the identity of the operated keys but also the force with which they are operated is made available, and can be decoded to control operation of the instrument.

SUMMARY OF THE INVENTION

It is the principal object of the present invention to provide an improved apparatus and method for multiplexing signals derived from the keyboard of an electronic musical instrument.

Another object of the present invention is to provide apparatus for multiplexing signals derived from the keys of an electronic musical instrument in which the output pulse train contains information relating not only to the operated keys but also to the force with which such keys are operated.

These and other objects and advantages of the present invention will become manifest by an inspection of the following description and the accompanying drawings.

In one embodiment of the present invention there is provided an oscillator made up of a plurality of individual identical stages, each having a time constant circuit incorporating a capacitor, the capacitance of which is varied in response to the force with which an associated key of the keyboard is depressed. An RC circuit in each stage introduces a delay between actuation of one stage and the following stage, which delay corresponds to the amount of capacitance in the RC circuit. All of the individual stages contribute pulses to an output line, and the separation between adjacent pulses is representative of the capacitance associated with the time constant circuit of one of the stages. The pulse train produced by the multiplexer includes a pulse for every key of the keyboard, and the delays between successive pulses are decoded to identify the operated keys and the force with which such keys are operated.

BRIEF DESCRIPTION OF THE DRAWINGS

Reference will now be made to the accompanying drawings, in which:

FIG. 3 is a schematic circuit diagram partly in functional block diagram form of apparatus for decoding the pulse train produced by the apparatus of FIG. 1;

FIG. 6 is a functional block diagram of a modified form of the invention; and

DESCRIPTION OF THE PREFERRED EMBODIMENTS

Figure 1:
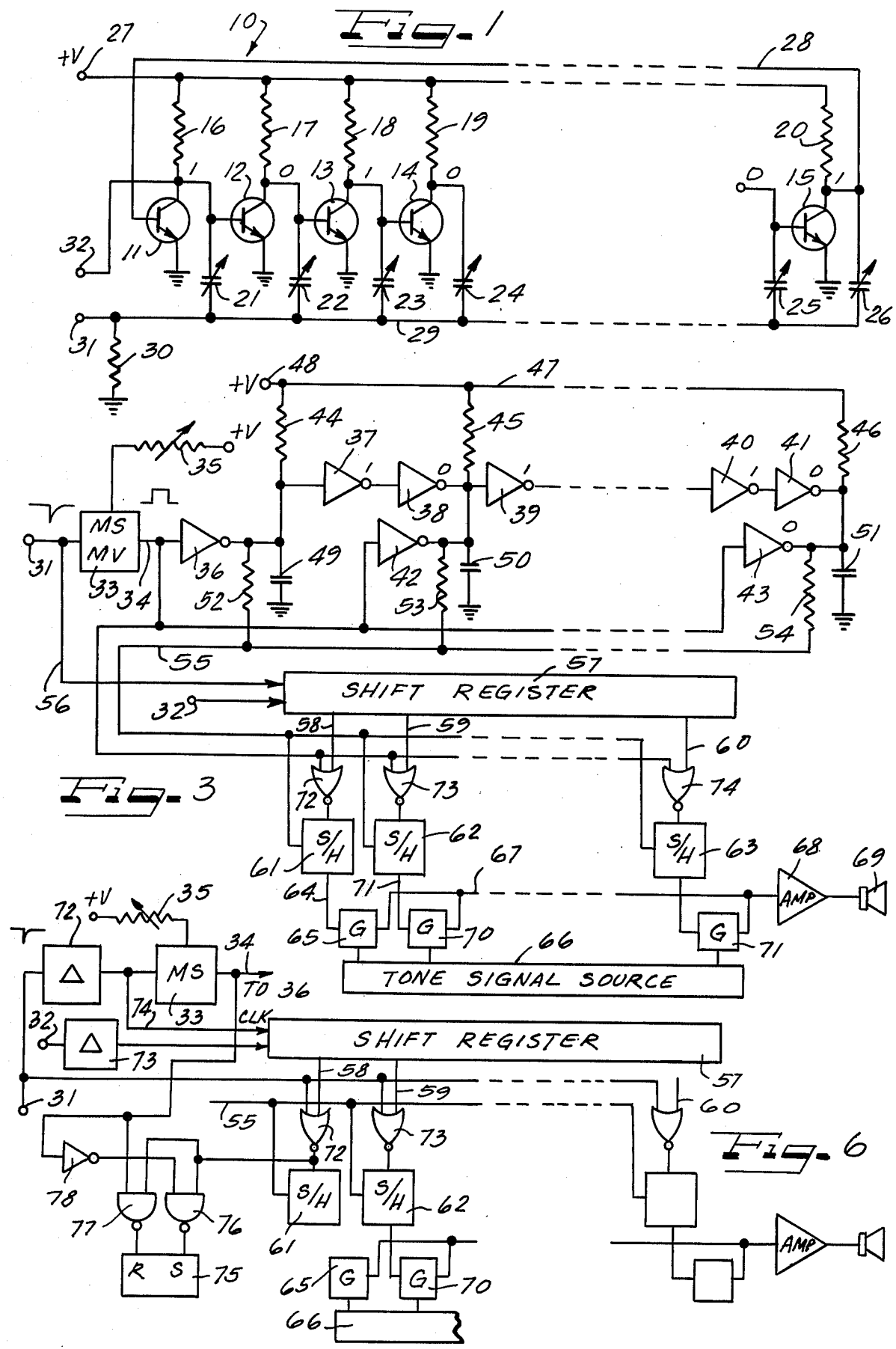
FIG. 1 is a schematic diagram, partly in functional block diagram form, of an oscillator used in an illustrative embodiment of the present invention.

Referring to FIG. 1, an oscillator 10 is illustrated which is made up of a plurality of identical stages. Each stage has a transistor 11-15 and an RC time circuit incorporating a resistor 16-20 and a capacitor 21-26. The resistors and capacitors are all connected in an identical fashion, so an explanation of one stage will suffice for all. The transistor 11 has its emitter connected to ground, and its collector is connected through the resistor 16 to a source of a positive voltage at a terminal 27. Its base is connected through a line 28 to the collector of the preceding stage, which is the stage including the transistor 15. Its collector is connected through the capacitor 21 to an output bus 29, and also to the base of the transistor of the following stage, namely transistor 12. A resistor 30 is connected between the output bus 29 and ground, and the output bus 29 is connected to a terminal 31. The collector of the transistor 11 only is connected to a second output terminal 32, which is used for synchronization purposes.

The oscillator 10 may have any number of stages, but it is necessary that the number of stages be odd. All of the transistors 11-15 operate in a saturated mode, so that in a steady stage condition they exhibit one of two voltage levels at their collectors. One of these levels is near the power supply potential applied to the terminal 27, and the other level is near ground. One state of the transistors 11-15 which occurs during operation of the oscillator is with the transistors 11, 13, and 15 being cut off and with the transistors 12 and 14 conducting fully. In this state, the collectors of the transistors 11, 13, and 15 are at a high level, while the collectors of the transistors 12 and 14 are at a low level. The capacitors 21-26 are in each case charged to the level of the collector to which it is connected. That is, the capacitor 21 has a relatively high charge, as the collector of the transistor 11 is high, while the capacitor 22 stores a relatively low charge, since the collector of the transistor 12 is low.

If a positive-going pulse is now applied to the base of the transistor 11, so as to render it conductive, the capacitor 21 is quickly discharged through the transistor 11, and the collector of the transistor 11 falls rapidly to its low level. The low level is applied to the base of the transistor 12, which immediately cuts off the transistor. The capacitor 22 then begins charging toward the voltage applied to the terminal 27 through the resistor 17, but because of the time constant associated with this circuit, does not do so immediately. Eventually the charge on the capacitor 22 is increased to the point where the transistor 13 is rendered conductive, which immediately discharges the capacitor 23 and cuts off the transistor 14. Thereafter the capacitor 24, connected to the collector of the transistor 14, begins to charge toward the voltage applied to the terminal 27.

This operation repeats in the same way for subsequent stages, with alternate stages being cut off and the remaining stages becoming conductive when the capacitor associated with their base terminal is sufficiently charged. Ultimately the capacitor 25 connected with the base of the transistor 15 becomes charged and renders the capacitor 15 conductive, which then discharges the capacitor 26 and cuts off the transistor 11. The capacitor 21 then begins to charge through the resistor 16, and the same operation as described above is repeated for subsequent stages until the capacitor 25 is discharged, cutting off the transistor 15. When the transistor 15 is cut off, the capacitor 26 is charged through the resistor 20, and a positive-going signal is applied over the line 28 to the base of the transistor 11. This signal initiates a repeat of the entire process as described above.

Figure 2:
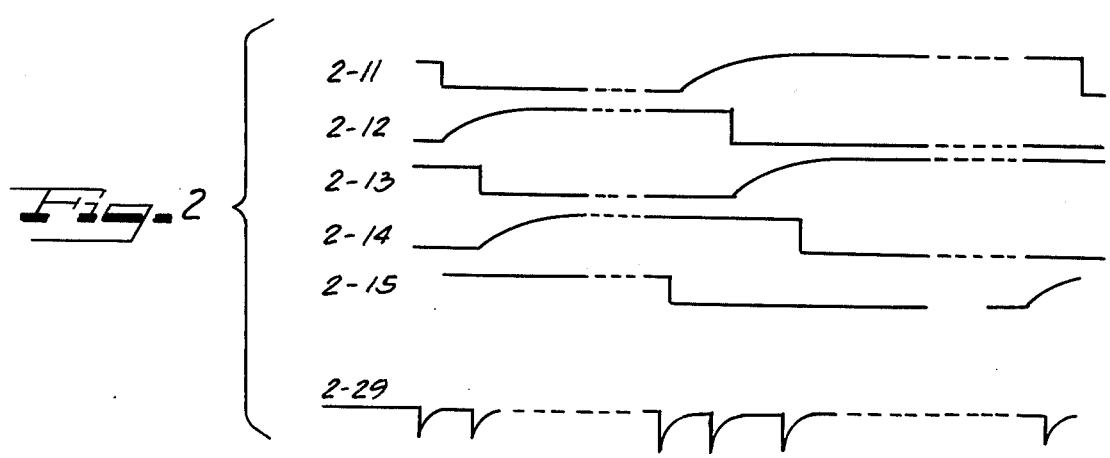
FIG. 2 shows a group of graphs illustrating voltage waveforms occurring at various points in the operation of the circuit of FIG. 1.

FIG. 2 contains a series of graphs depicting waveforms of the voltage levels present at the outputs of successive stages. The graph 2–11 illustrates the potential on the collector of the transistor 11; the graph 2–12 illustrates the potential on the collector of the transistor 12; and so on. It will be seen that the time sequence of the transitions of the states of the individual stages begins with a sharp decrease in the voltage level at the collector of the transistor 11, and this is followed by a gradual increase of the potential at the transistor 12, then by a sharp decrease in the potential of the collector of the transistor 13, and so on. Each of the decreases in potential produces a negative-going pulse on the output bus 29, the waveform of which is illustrated in graph 2–29 of FIG. 2. The first negative-going pulse indicates the conduction of the transistor 11, the second indicates the conduction of the transistor 13, and so on. Later on, a negative pulse is produced when the transistor 15 goes into conduction, and this is followed by successive negative pulses when the transistors 12 and 14 go into conduction. The cycle begins a repetition when the transistor 11 goes into conduction again, producing another negative pulse on the bus 29.

The interval between successive pulses is dependent upon the time constant of an individual circuit. The interval between the first two pulses of the waveform 2–29 in FIG. 2 is dependent upon the time constant of the circuit associated with the output of the transistor 11.

The time interval between the first two pulses present on the output bus 29 is dependent on the time constant of the RC circuit associated with the output of the transistor 11. The interval between the second and third pulses is dependent upon the time constant of the circuit associated with the transistor 13. In the period after the transistor 15 becomes conductive, the interval between the negative pulse produced upon its becoming conductive and the succeeding pulse is dependent on the time constant of the circuit associated with the output of the transistor 15. The interval between subsequent pulses depends on the time constant of the circuit associated with the transistors 12 and then 14, etc.

It is apparent that the pulse train illustrated in graph 2–29 contains a pulse for each stage of the oscillator 10, but the interval which follows a pulse associated with the conduction of the transistor of each stage is dependent on the time constant of the circuit associated with the output of that transistor.

The resistors 16–20 are all of equal value, and so the time constant of each circuit depends entirely upon the capacitance of the capacitors 21–26. These capacitors are all variable capacitors and have a capacitance which is dependent upon the amount of force with which a key of the keyboard is depressed. Suitable variable capacitors are disclosed and claimed in application Ser. No. 588,320, filed contemporaneously herewith. Keys which are not depressed cause minimum delays following their particular pulses in the output pulse train, while keys which are depressed cause delays following their pulses in response to the force with the key is depressed. Thus, the pulse train present on the output bus 29 contains information relative both to which of the keys of the keyboard are operated and the force with which such keys are depressed.

Apparatus for decoding the information present on the output bus 29 is illustrated in FIG. 3. The terminal 31, to which the output bus 29 is connected, is connected to an input of a resettable monostable multivibrator 33, which produces a positive-going pulse on an output line 34 for a settable period. The period is adjustable by means of a variable resistor 35 connected with the multivibrator 33. The line 34 is connected to the input of an inverter 36, which is one of a string of inverters 36–41. The inverters 36–41 are connected in cascaded fashion, so that normally successive ones of the inverters are in alternate states. Thus, the positive-going signal applied to the input of the inverter 36 causes it to produce a low level output signal, the succeeding inverter 37 produces a high output signal, the next inverter 38 produces a low output signal, and so on. Although six inverters have been shown in the chain in FIG. 3, it will be understood that more inverters are included although they are not shown, since they are identical with the inverter stages which are shown.

The line 34 is connected to a pluralty of additional inverters 42 and 43, which are associated with inverters 38–41, and the other inverters (not shown) which present low voltage levels at their outputs in response to the positive-going signal on the line 34. Their purpose is to execute a resetting function which is described hereinafter.

A plurality of resistors 44–46 are provided, each of which connects a junction between two successive inverters to a line 47 which is connected to a source of positive potential applied to a terminal 48. The resistor 44 is connected to the junction of the inverters 36 and 37; the resistor 45 is connected to the junction of the inverters 38 and 39; and the resistor 46 is connected to the output of the inverter 41. It will be understood that other resistors (not shown) are associated with each additional pair of inverters (not shown). A plurality of capacitors 49–51 are connected between the outputs of some of the inverters and ground. The capacitor 49 is connected between the output of the inverter 36 and ground; the capacitor 50 is connected between the output of the inverter 38 and ground; and so on. In the steady state condition, after a positive-going signal is applied to the line 34, all of the capacitors 49–51 are substantially discharged to the low level present at the output of the inverters 36, 38, 41, 42, 43, etc.

When the multivibrator 33 times out, the positive-going signal applied to the line 34 goes low and the inverter 36 is cut off, opening the discharge circuit for the capacitor 49. The capacitor 49 is then charged, by current flowing from the terminal 48 through the resistor 44, and the voltage across it increases at an exponential rate, in accordance with the time constant of the circuit. When the voltage across the capacitor 49 reaches the threshold of operation of the inverter 37, the inverter 37 operates, producing a low output signal, which cuts off the inverter 38. This allows the capacitor 50 to charge through the resistor 45. This operation is repeated successively at successive stages of the circuit of FIG. 2, and in the last stage, the inverter 41 becomes cut off, allowing the capacitor 51 to charge through the resistor 46.

As long as the potential on the line 34 remains low, the inverters 42 and 43 are cut off, so they do not influence the charging of the associated capacitors 50 and 51. All of the inverters 36–43 have a relatively high output impedance when they are cut off, so that they are not able to furnish much charging current to the capacitors with which they are connected. Accordingly, the time delay introduced by the capacitors 49–51 is dependent primarily upon the resistor through which it is charged from the terminal 48. Each stage has an equal time constant.

A plurality of resistors 52–54 connects the ungrounded terminals of the capacitors 49–51 to a common output line 55. The resistors 52–54 from an analog summing device, and accordingly the voltage level on the line 55 increases gradually as the capacitors 49–51 are charged in successive fashion.

The summing network formed by the resistors 52–54 produces an increasing voltage on the line 55 during the period that the capacitors 49–51 are charging. This produces an increasing ramp-like waveform, which begins at the moment that the multivibrator 33 times out, producing the low level signal on the line 34.

The input pulses delivered to the multivibrator 33 are derived from the terminal 31, and comprise the pulses collected on the bus 29 which are illustrated in graph 2-29 of FIG. 2. The spacing between these pulses is dependent on the force applied to the operated keys of the keyboard, and so pulses which occur closely together are representative of unoperated keys of the keyboard. The time period of the multivibrator 33 is set slightly longer than the pulse interval between pulses representative of non-operated keys, so that each such pulse retriggers the multivibrator 33 and prevents it from timing out. During this period the voltage level on the line 34 remains high, and the voltage level on the line 55 remains low.

When the spacing between successive pulses applied to the terminal 31 exceeds the period of the multivibrator 33, the multivibrator 33 times out before the next pulse arrives, and starts the formation of a ramp voltage on the line 55. The voltage level on the line 55 is sensed at the instant of arrival of the next pulse, and this voltage is indicative of the force with which the operated key of the keyoard has been operated. This voltage level is stored in a sample-and-hold device, and the identity of the operated keys are stored in a sample-and-hold device, which will now be described.

The terminal 31 is connected by a line 56 to the clock input of a shift register 57. The terminal 32 is connected to the data input terminal of the first stage of the shift register 57, so that the operation of the shift register 57 is synchronized with the operation of the oscillator illustrated in FIG. 1.

The shift register 57 has a plurality of outputs 58–60, one associated with each of the stages of the oscillator of FIG. 1. The first output 58 goes high during the interval between the first and second pulses applied to the line 29, which corresponds to the period between pulses determined by the value of the capacitor 22 (FIG. 1).

The output 58 is connected via a NOR gate 72, to the trigger input of a sample-and-hold unit 61, which receives its signal input from the line 55. As long as the signal is present on the line 58, i.e. during the period between the first and second pulses, the sample-and-hold unit 61 is conditioned to receive and store the increasing voltage level on the line 55. When the next pulse arrives at the terminal 31, the signal on the line 58 ceases and a signal is manifested on the line 59. At the end of the signal on the line 58, the sample-and-hold unit 61 is disabled, but it continues to manifest the voltage level which was present on the line 55 at that instant. Since the voltage level on the line 55 remains low until after the period of the multivibrator 33, the sample-and-hold unit 61 stores a zero voltage level if the second pulse appears before the time out of the multivibrator 33, indicating that the key was unoperated. If the second pulse arrives later, indicating an operated condition of the key, the voltage level stored and manifested by the sample-and-hold unit 61 is dependent on the interval between time out of the multivibrator 33 and the arrival of the second pulse.

After the second pulse, the second output line 59 of the shift register is energized, and a sample-and-hold unit 62 connected thereto is enabled, via a NOR gate 73. It receives a signal input from the line 55, and functions in the same way which has been described for the sample-and-hold unit 61, except that it functions to store a voltage level which is dependent on the delay between the second and third pulses applied to the line 31. This is dependent on the value of the capacitor 24 of the oscillator (FIG. 1).

A similar sample-and-hold unit is provided for each output of the shift register 57, with the sample-and-hold unit 63 being provided for the last output 60 and its associated NOR gate 74.

The sample-and-hold unit 61 manifests its output on an output line 64, which is connected to the control input of an analog gate 65. The signal input of the analog gate 65 is connected to an output of a tone signal source 66, which is adapted to produce a plurality of different tone signals on separate output lines. One of the tone signals corresponds to the key which controls the capacitance of the capacitor 22, and this is the signal which is connected to the gate 65. The output of the gate 65 is connected to a bus 67, which is connected to the input of an amplifier 68, the output of which is connected to a loudspeaker 69. The amplifier 68 and loudspeaker 69 form the output system of the instrument.

An analog 70 is provided for the sample-and-hold unit 62, and the output line 71 of the sample-and-hold unit 62 is connected to the control input of the gate 70. The signal input input of the gate 70 is connected to the output of a tone signal source 66 which corresponds to the key controlling the capacitance of the capacitor 24, and its output is connected to the bus 67. A similar analog gate is provided for all of the other sample-and-hold units, with the gate 71 being provided for the sample-and-hold unit 63. They all are connected in the same manner as described above, with their outputs connected in common on the bus 67. The voltage level on the control inputs to each of the analog gates 65, 70, and 71 determines the amplitude of the signal furnished by that gate to the bus 67. That is, a relatively high voltage level on the control input causes a high amplitude signal to be provided to the bus 67 from the corresponding output of the tone signal source 66. If the voltage level is lower, a reduced amplitude of tone signal is provided to the output bus. If the voltage level is zero, as it is for the sample-and-hold units associated with unoperated keys, none of the associated tone signal is provided to the output. Accordingly, the apparatus of FIG. 3 functions to decode both the identification of the operated keys and the force with which keys operated, in order to provide appropriate signals to the output bus 67.

A succeeding pulse, which arrives at the terminal 31 after the multivibrator 33 is timed out, finds the circuit of FIG. 2 in a condition in which some of the inverters 36-41 have switched and others have not, with the voltage level on the line 55 at some intermediate value. It is necessary to reset the inverters 36-41 to their beginning state, so that a new ramp can be begun when the multivibrator 33 times out. For this purpose, the inverters 42 and 43 (and others like them but not shown) are provided for quickly discharging the capacitors 50 and 51. The inverter 36 performs a similar function with respect to the capacitor 49. Since the output impedance of each of the inverters is relatively low when it exhibits a low voltage level, discharge takes place relatively rapidly, and is completely finished during the period of the multivibrator 33.

During the operation of the apparatus of FIG. 3, the sample-and-hold units 61-63 are reset when the signal on the line 34 goes low, by means of the NOR gates 72-74 associated with each of the sample-and-hold units 61-63. The NOR gate 72 has one input connected to the line 58 of the shift register 57 and the other input connected to the line 34. A positive-going signal is produced at the output of the NOR gate 72 only when both the lines 58 and 34 are low, which occurs during the energization of the line 58 (between the first and second pulses applied to the terminal 31) and after the time out of the multivibrator 33. Thus, each sample-and-hold unit 61-63 is reset during each cycle of the ramp unit as long as the associated key is operated, so that it can respond to decreasing amounts of force applied to the associated key as well as to increasing amounts of force. As a key of the keyboard is depressed and then released, the force first increases and then decreases to zero. As this occurs, a great number of cycles of operation of the oscillator take place, and the associated sample-and-hold unit functions to store the new voltage level corresponding to the instantaneous force on the key. As this force is reduced to zero, the voltage level manifested by the sample-and-hold unit decreases more and more and the output manifested on its output line drops below the threshold of the analog gate 65, 70, or 71 with which it is associated. In this manner, the tone signal applied to the analog gate is modulated and eventually reduced to zero.

Figure 4:
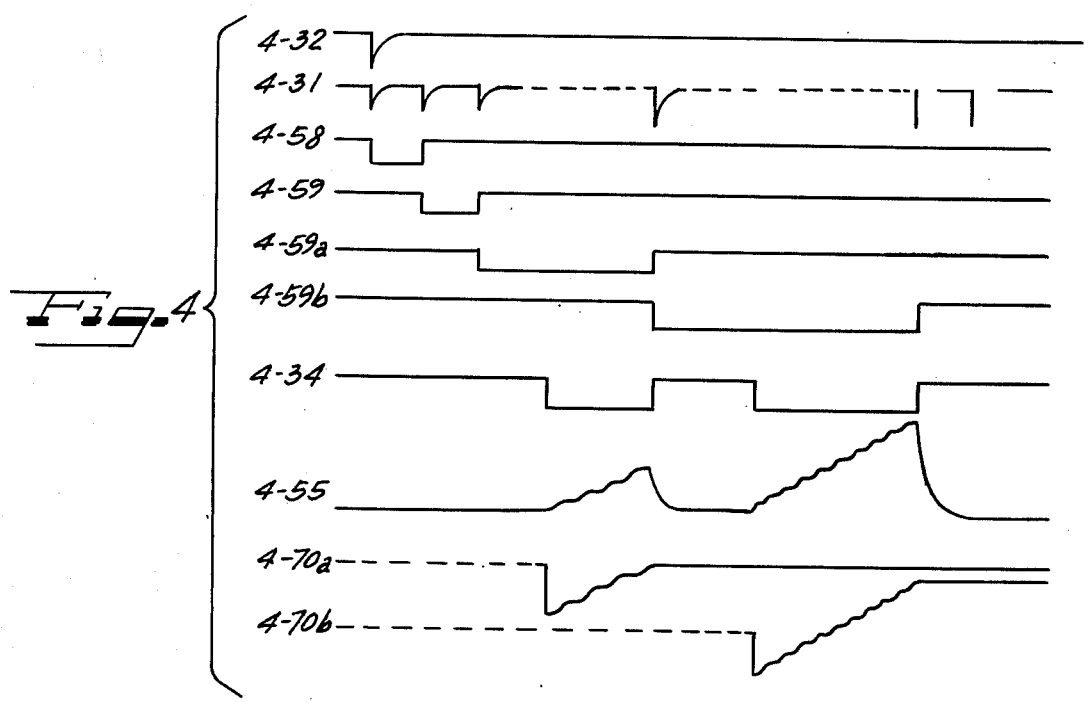
FIGS. 4 and 5 show groups of graphs illustrating operation of the apparatus of FIG. 3.
Figure 5:
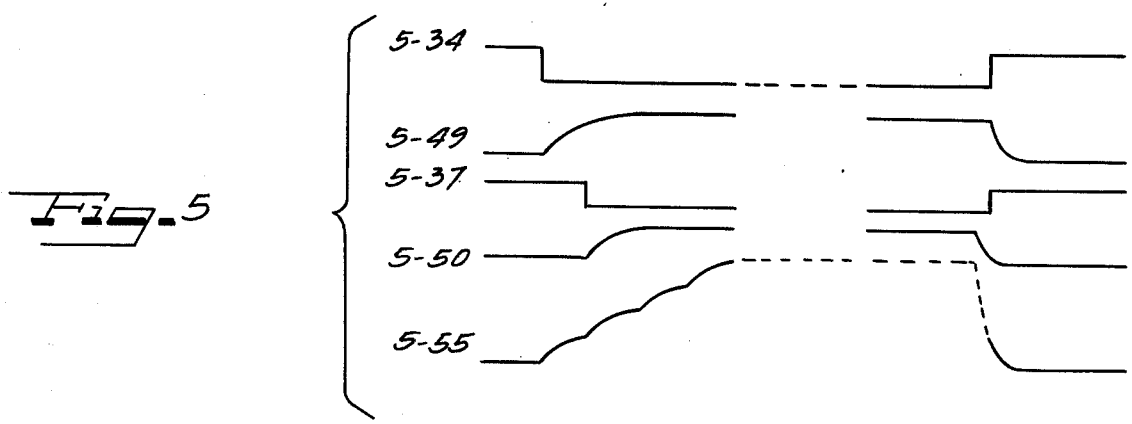

Referring to FIGS. 4 and 5, waveforms are shown which illustrated the voltage levels present at various portions of the circuit of FIG. 3 during operation thereof. A synchronizing pulse present at the terminal 32 is shown in graph 4-32, and the pulses produced on the bus 29 and presented to terminal 31 are shown in graph 4-31. The graphs 4-58 through 4-59b illustrate outputs of the shift register 57 for successive pulses received on the terminal 31. The graph 4-34 shows the voltage level on the line 34 which is connected to the output of the multivibrator 33. The graph 4-55 shows a voltage level on 55, which is a ramp waveform generated during the periods in which the voltage level on the line 44 is low. The graphs 4-70a and 4-70b illustrate the outputs on two sample-and-hold units corresponding to the intervals for which the line 34 is low. As illustrated in FIG. 4, the second of these sample-and-hold units is provided with a longer ramp, and accordingly stores a higher voltage level than the first, in accordance with the spacing between pulses presented to the terminal 31, as described above.

FIG. 5 contains waveforms illustrated in the operation of the ramp generator. Graph 5-34 is the waveform of the voltage level applied to the line 34. Graph 5-49 shows the voltage across the capacitor 49, which begins its charge as the voltage on the line 34 falls. Graph 5-37 shows the voltage at the output of the inverter 37, which falls when the voltage across the capacitor 49 exceeds its threshold. Graph 5-50 illustrates the voltage across the capacitor 50, which begins to charge when the voltage level at the output of the inverter 37 falls. Graph 5-55 illustrates the waveform present on the line 55 during formation of the ramp. When the voltage on the line 34 goes up, the capacitors 49 and 50 are quickly discharged, and the voltage on the line 55 falls accordingly.

In FIG. 6 an alternative embodiment of a portion of the apparatus illustrated in FIG. 3 is shown, in which the sample-and-hold units 61 and 62 are not reset to zero during each sampling period, as they are in the apparatus of FIG. 3. They are triggered by a pulse presented to the line 31 which is connected directly to the gates 71 and 72 to trigger the sample-and-hold unit which corresponds to the active output of the shift register 57. A delay unit 72 is interposed between the terminal 31 and the multivibrator 33, to delay setting of the ramp generator until after the appropriate sample-and-hold unit has been set. An additional delay unit 73 is interposed between the terminal 32 and the data input of the shift register 57, so that the shift register 57 is not reset until after the end of a pulse appearing on the line 31.

In operation, a pulse appears simultaneously on terminals 31 and 32, and is effective to trigger a sample-and-hold unit (not shown) associated with the last stage of the shift register 57. After a short delay, introduced by the delay unit 72, the multivibrator 33 is triggered, and the state of the shift register 57 is advanced at this time by a pulse on the line 74. The voltage level on the line 34 goes up for the period of the multivibrator 33, as described above.

The second pulse which arrives at terminal 31 finds the shift register in its first state with the line 58 activated, and so it operates the gate 72 which functions to set the sample-and-hold unit 61 to the level then on the line 55, which corresponds to the ramp voltage at that instant, and which may be more or less than the previously stored voltage level in the sample-and-hold unit 61. After the sample-and-hold unit has been set, a further pulse appears at the output of the delay unit 72 which again advances the state of the shift register 57. The state of the shift regoster 57 is advanced for each pulse applied to the terminal 31, irrespective of whether the multivibrator 33 times out.

It will be apreciated that in the operation of the apparatus of FIG. 6, the voltage levels stored in the sample-and-hold units 61 and 62, etc., are not reset to zero during each cycle, but are set directly from one level to another in accordance with changes in the force applied to the keys of the keyboard.

For some applications it may be desirable to provide a digital indication of which of the keys have been operated, and, if so, a plurality of flip-flops (not shown) may be provided for this purpose. One such flip-flop 75 is shown associated with the NOR gate 72. The flip-flop comprises an RS flip-flop having NAND gate 76 with its output connected to the set input of the flip-flop 75 and a NAND gate 77 with its output connected to the reset input of the flip-flop 75. The output of the NOR gate 72 is connected to one input each of the NAND gates 76 and 77, to enable one or the other of these gates at the time that the sample-and-hold unit 61 is gated. The line 34 is connected to the second input of the NAND gate 76 through an inverter 78 directly to the second input of the NAND gate 77. Accordingly, one of the gates 76 and 77 is actuated at the time the sample-and-hold unit 61 is triggered, in accordance with whether there is a high level voltage on the line 34. If the associated key has been operated, the voltage on the line 34 will be low at this time, indicating that a ramp function is being generated, so that both of the inputs to the NAND gate 76 are high, and the flip-flop 75 is set. If the voltage level on the line 34 is high, indicating that the associated key has not been operated, the two inputs to the gate 77 are high and the flip-flop 75 is reset. Although only one flip-flop 75 has been illustrated in FIG. 6, itwill be understood that a similar flip-flop is provided for each of the sample-and-hold units, with their set and reset gates connected with the line 34 and with the individual outputs of the NOR gates 72, 73, 74, etc.

Figure 7:
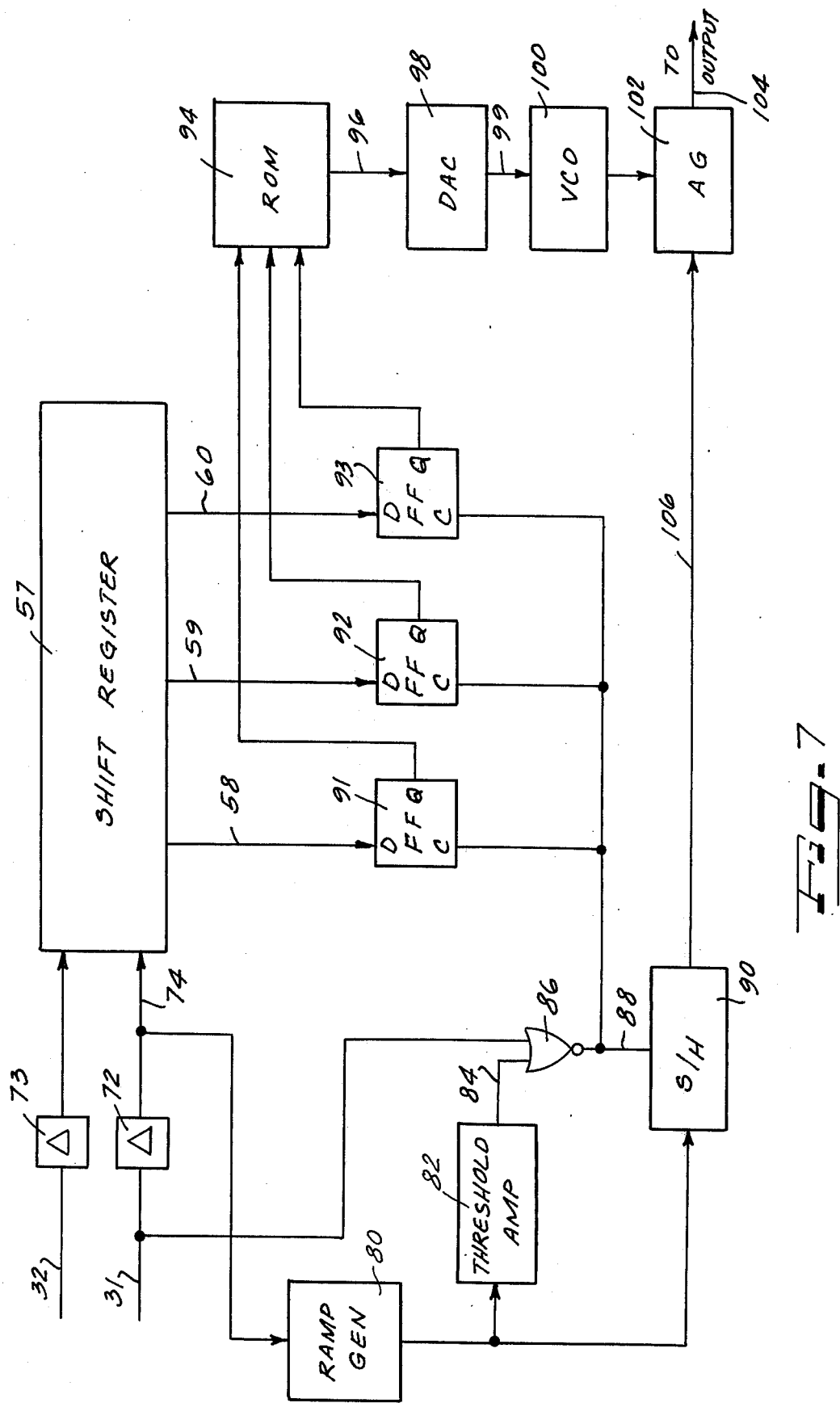
FIG. 7 is a functional block diagram of another embodiment of the present invention.

In FIG. 7, another embodiment of the present invention is illustrated. The lines 31 and 32, connected to the oscillator of FIG. 1, are connected to the shift register 57 in the same manner as shown in FIG. 6. A conventional ramp generator 80 is connected to the output of the delay unit 72, and initiates a ramp for each pulse applied to the line 31. The ramp is connected to the input of a threshold amplifier 82, which produces a low level output in a line 84 when the ramp persists long enough to exceed the threshold of the amplifier. The line 84 is connected to one input of a NOR gate 86, the other input of which is connected to the line 31. When the gate 86 is enabled by a low level on the line 84, it inverts the next pulse applied to the line 31, and presents it to its output line 88, which is connected to the gate or trigger input of a sample-and-hold unit 90. The signal input of the sample-and-hold unit 90 is connected to the output of the ramp generator 80. Thus the sample-and-hold unit samples the ramp level just before the next pulse resets the ramp generator and initiates generation of a new ramp.

The output of the gate 86 is also applied to the clock inputs of a plurality of D-type flip-flops 91-93, the D inputs of which are connected to the output lines 58-60 of the shift register 57. The condition of the shift register 57 is thus stored in the D latches at the time of arrival of a pulse on the line 31, and this condition is indicative of the key of the keyboard responsible for generation of the sampled ramp.

One output of each of the flip-flops 91-93 is connected to the address section of a read only memory or ROM 94, which produces, on one or more output lines 96 a digital signal corresponding to the data stored at the ROM location which is addressed by the address section. The lines 96 are connected to a digital-to-analog converter 98, which produces a corresponding voltage level on a line 99, connected to control the frequency of operation of a voltage controlled oscillator or VOC 100. The VOC furnishes a signal to the signal input of an analog gate 102, from which a line 104 is connected to the output system of the instrument. The control input of the analog gate is connected by a line 106 to the output of the sample-and-hold unit 90, so that the amplitude of the signal passed to the output line 104 is dependent on the voltage level sampled and held in the sample-and- hold unit 90.

It will be appreciated that the apparatus of FIG. 7 is a monophonic apparatus which can sound only one note at a time. Its economy of structure, and its ability to decode both the depressed keys of the keyboard and the force with which such keys are depressed represents a considerable advance in monophonic musical instruments.

In the foregoing, apparatus has been described by which the operated keys of a keyboard of an electronic musical instrument may be scanned repetitively to produce a multiplex signal identifying the operated keys and the force with which such keys are operated. It will be apparent that various additions and modifications may be made to the present invention without departing from the essential features of novelty thereof, which are intended to be defined and secured by the appended claims.

What is claimed is:

1. A multiplexer for an electronic musical instrument having a keyboard, comprising a plurality of stages connected in series so that all of such stages operate successively, each of said stages having a time constant determining circuit for establishing a period of delay between operation of such stage and operation of a following stage, said time constant determining circuit having circuit means controlled by operation of an associated key of said keyboard so that operation of a key varies said period of delay, and decoding means connected with all of said stages and responsive to a variation in said delay of any stage for producing output signals which uniquely identify operated ones of said keys.

2. Apparatus according to claim 1, wherein said time constant determining circuit is a resistance-capacitance circuit.

3. Apparatus according to claim 1, wherein said time constant determining circuit includes a variable capacitor, the capacitance of said variable capacitor varying in accordance with the force of operation of an associated key of said keyboard.

4. Apparatus according to claim 1, including means for connecting all of said stages to a common output terminal, whereby there is produced at said terminal a train of pulses responsive to operation of individual ones of said stages, said pulses being spaced apart in time in response to the time constant determining circuits of individual ones of said stages.

5. Apparatus according to claim 1, wherein said decoding means comprises a ramp generator, means responsive to operation of one of said stages for subsequently starting operation of said ramp generator, and means for storing the instantaneous value of the output of said ramp generator at the time of operation of another said stage.

6. Apparatus according to claim 1, including means for connecting all of said stages to a single terminal, and wherein said decoding means comprises means connected to said terminal and responsive to pulse signals appearing at said terminal at the operation of individual ones of said stages to discriminate between pulse signals which are spaced more than a predetermined interval apart from pulse signals which are not so spaced.

7. Apparatus according to claim 6, wherein said last-named means comprises a retriggerable monostable multivibrator having a time of operation equal to said predetermined interval.

8. Apparatus according to claim 5, wherein said ramp generator comprises a plurality of identical circuits connected in cascade, each circuit having delay means for causing a successive circuit to operate at a time following operation of the preceding circuit, means normally holding all of said circuits in a first state, means responsive to operation of one of said stages for switching a first of said circuits to a second state, after which succeeding circuits are switches to said second state, and output means for manifesting a ramp voltage in accordance with the number of circuits which have been switched to their second states.

9. Apparatus according to claim 1, wherein said decoding means comprises a shift register, means for operating said shift register in synchronism with said ring oscillator, said shift register having a plurality of stages with individual output lines, a plurality of bistable storage devices, one for each of said plurality of stages, and means for setting at least one of said storage devices in accordance with the state of said shift register when said period of delay exceeds a predetermined amount.

10. Apparatus according to claim 9 including a signal generating apparatus connected to said storage devices and operable in response thereto for producing an output signal having one parameter corresponding to an operated key and an amplitude corresponding to said period of delay.

11. Apparatus according to claim 1, wherein said plurality of stages comprises a plurality of identical stages.

12. Apparatus according to claim 1, wherein said plurality of stages are connected together in a ring so that all of such stages operate successively and repetitively.

13. Apparatus according to claim 1 including means connected to said decoding means and responsive thereto for producing musical sounds in accordance with said operated keys.

* * * * *